US012608527B2

(12) United States Patent
Paulose et al.

(10) Patent No.: US 12,608,527 B2
(45) Date of Patent: Apr. 21, 2026

(54) SYSTEMS AND METHODS FOR PROGRAMMING ELECTRICAL FUSE

(71) Applicant: Texas Instruments Incorporated, Dallas, TX (US)

(72) Inventors: Ajai Paulose, Kerala (IN); Aravind Ganesan, Bangalore (IN); Sashidharan Venkatraman, Telangana (IN); Jaiganesh Balakrishnan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 881 days.

(21) Appl. No.: 17/411,262

(22) Filed: Aug. 25, 2021

(65) Prior Publication Data

US 2022/0229961 A1 Jul. 21, 2022

(30) Foreign Application Priority Data

Jan. 18, 2021 (IN) .............................. 202141002238

(51) Int. Cl.
G06F 30/34 (2020.01)
G06F 16/174 (2019.01)
(52) U.S. Cl.
CPC .......... G06F 30/34 (2020.01); G06F 16/1744 (2019.01)
(58) Field of Classification Search
CPC ...................................................... G06F 30/34

USPC ......................................................... 716/117
See application file for complete search history.

(56) References Cited

U.S. PATENT DOCUMENTS

| | | | |
|---|---|---|---|
| 7,859,934 B2 | 12/2010 | Taniguchi et al. | |
| 8,281,190 B2 * | 10/2012 | Gunderson | ............ G11C 29/16 |
| | | | 714/736 |
| 9,772,376 B1 | 9/2017 | Kawoosa et al. | |

FOREIGN PATENT DOCUMENTS

CN 1790291 A 6/2006

OTHER PUBLICATIONS

International Search Report, PCT/US2022/012704, mailed Apr. 21, 2022, 2 pgs.

* cited by examiner

*Primary Examiner* — Eric D Lee
(74) *Attorney, Agent, or Firm* — Xianghui Huang; Frank D. Cimino

(57) ABSTRACT

A system for programming an eFuse array in an integrated circuit (IC) includes an eFuse data file which has a first plurality of bits. The system includes a data compression module which has an input coupled to receive the eFuse data file. The data compression module reduces the size of the eFuse data file and provides a compressed data file. The compressed data file has fewer bits than the eFuse data file. The system includes an eFuse controller which has an input coupled to receive the compressed data file. The eFuse controller programs the eFuse array to permanently store the compressed data file in the eFuse array.

24 Claims, 2 Drawing Sheets

SYSTEMS AND METHODS FOR PROGRAMMING ELECTRICAL FUSE

CROSS REFERENCE TO RELATED APPLICATION(S)

This application claims priority to India Provisional Application No. 202141002238, filed Jan. 18, 2021, which application is incorporated herein by reference in its entirety.

TECHNICAL FIELD

This description relates generally to electrical fuses.

BACKGROUND

Electrical fuses (eFuses) are commonly used as one-time programmable (OTP), non-volatile memory in integrated circuits (ICs). An eFuse has a fuse body in an un-programmed state. The eFuse is programmed by applying a voltage across the fuse body to melt and separate the fuse body material. As a result, the resistance of the eFuse changes from a low pre-blow resistance to a high post-blow resistance. The resistance is sensed to determine the state of the eFuse. An eFuse array is a collection of hundreds or thousands of eFuses connected in arrays.

According to commonly used protocols, to write "1", the fuse body is blown and to write "0", the fuse body is retained (i.e., not blown). Commercially available software (e.g., SECO, SCU) are used to program eFuses.

A drawback of eFuses is that they occupy a relatively large area in a die (e.g. on or over a semiconductor substrate). For example, it requires 1.5 sq-mm area in a 28 nm process die to implement 1.8K eFuses. Thus, efficient utilization of eFuses is desirable.

SUMMARY

In one aspect, a system includes a compression module which receives a data file having a first plurality of bits. The system outputs a compressed data file having a second plurality of bits that is less than the first plurality of bits. The system includes an integrated circuit (IC) coupled to the compression module. The IC includes an eFuse array which stores the compressed data file. The system includes a decompressor coupled to the eFuse array. The decompressor decompresses the compressed data file stored in the eFuse array.

In an additional aspect, the compression module is an encoder which provides the compressed data file by eliminating statistical redundancies in the first plurality of bits of the data file.

In an additional aspect, the compression module includes a first computer-readable medium having program code stored therein to reduce the size of the data file and provide the compressed data file.

In an additional aspect, the first plurality of bits of the data file is a digital representation of device-specific trims for an IC.

In an additional aspect, a system for applying device-specific trims to an integrated circuit (IC) includes a data compression module which has an input coupled to receive a device-trim file having a first plurality of bits. The system outputs a compressed data file having a second plurality of bits that is less than the first plurality of bits. The IC is coupled to the data compression module. The IC includes an eFuse array which stores the compressed data file. The system includes a data decompression module coupled to the eFuse array. Based on receiving the compressed data file, the data decompression module outputs a decompressed data file. The system includes a processor coupled to the data decompression module. The processor applies device-specific trims to the IC based on the decompressed data file.

In an additional aspect, a system for applying a patch to an integrated circuit (IC) includes a data compression module having an input coupled to receive a patch file having a first plurality of bits. The system outputs a compressed patch file having a second plurality of bits that is less than the first plurality of bits. The IC is coupled to the data compression module. The IC includes an eFuse array which stores the compressed patch file. The system includes a data decompression module coupled to the eFuse array. Based on receiving the compressed patch file, the data decompression module outputs a decompressed patch file. The system includes a random access memory (RAM) coupled to the data decompression module. The decompressed patch file is stored in the RAM.

BRIEF DESCRIPTION OF THE DRAWINGS

The same reference numbers or other reference designators are used in the drawings to designate the same of similar (functionally and/or structurally) features.

DETAILED DESCRIPTION

Figures 1, 2:
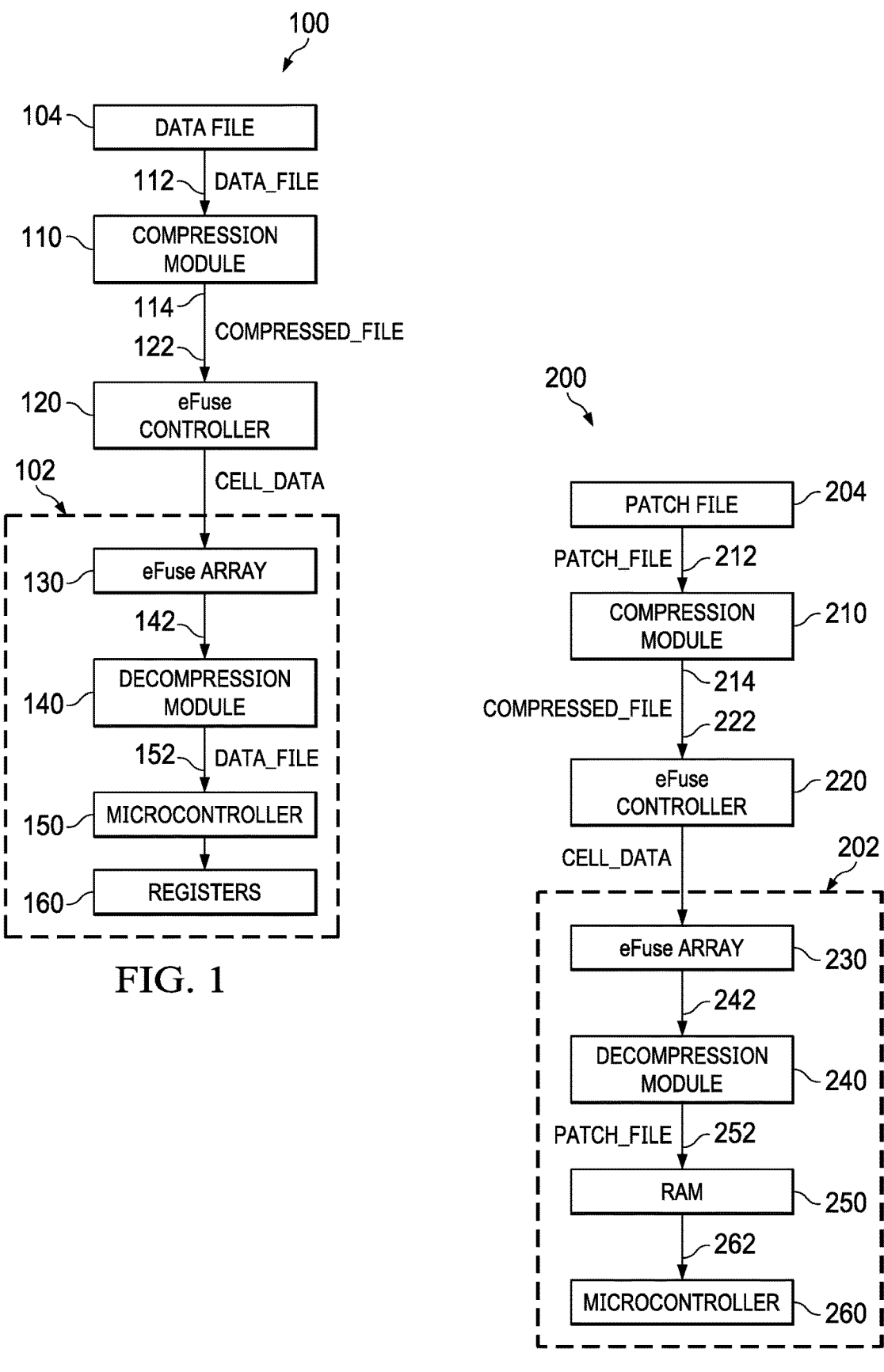
FIG. 1 is a block diagram of a system for applying device trims to an IC.
FIG. 2 is a block diagram of a system for applying a patch to an IC.

FIG. 1 is a block diagram of a system 100 of an example embodiment. The system 100 is used to program an eFuse array to permanently store data in an IC 102.

The system 100 includes a data file 104 (e.g., an eFuse data file). The data file 104 [DATA_FILE] has a string of binary bits which is a digital representation of the data (e.g., 1.8K bits, 2.5K bits) that will be permanently stored in an eFuse array that is incorporated into the IC 102. The system 100 includes a data compression module 110 which has an input 112 coupled to receive the data file 104 [DATA_FILE]. The data compression module 110 reduces the size of the data file [DATA_FILE] and provides a compressed data file [COMPRESSED_FILE] at an output 114. As a result of the compression, the compressed data file [COMPRESSED_FILE] has fewer binary bits than the data file 104 [DATA_FILE].

In an example embodiment, the data compression module 110 is an encoder which compresses the data file 104 [DATA_FILE] by eliminating statistical redundancies in the string of binary bits of the data file 104. In some example embodiments, the data compression module 110 includes a computer-readable medium which has program code recorded thereon to reduce the size of the data file 104 by identifying and eliminating statistical redundancies in the string of binary bits of the data file 104.

In an example embodiment, the data compression module 110 applies the Lempel-Ziv (LZ) compression algorithm to compress the data file 104. In other embodiments, a different compression algorithm (e.g., DEFLATE) may be used. The data compression module 110 may be implemented in hardware (e.g., logic circuitry, state machine, microprocessor, application-specific-integrated-circuit), firmware and/or software.

The system includes an eFuse controller 120 which has an input 122 coupled to receive the compressed data file [COMPRESSED_FILE]. The eFuse controller 120 provides cell data [CELL_DATA] to program an eFuse array 130 to store the binary bits of the compressed data file [COMPRESSED_FILE]. The cell data [CELL_DATA] is a digital representation of the state of the eFuses in the eFuse array 130 and is used to facilitate storing of the compressed data file [COMPRESSED_FILE] in the eFuse array 130. The eFuse controller 120 may be implemented in hardware (e.g., logic circuitry, state machine, microprocessor, application-specific-integrated-circuit), firmware and/or software.

In an example embodiment, the eFuse controller 120 includes a computer-readable medium which has program code stored therein to program the eFuse array 130. The eFuse controller 120 applies a voltage across the fuse body (not shown in FIG. 1) of certain eFuse in the array 130 to melt and separate the fuse body material. As a result, the resistance of the eFuse changes from a low pre-blow resistance to a high post-blow resistance. According to a commonly used convention, to write "1" the fuse body is blown, and to write "0" the fuse body is not blown. In an example embodiment, the eFuse controller 120 includes commercially available software (e.g., SECO, SCU) to program the eFuse array 130.

Due to compression of the data file by compression module 110, the compressed data file [COMPRESSED_FILE] has fewer binary bits than the data file the[DATA_FILE]. Thus, fewer eFuses are required to store the data file [DATA_FILE] in the eFuse array 130. Because fewer eFuses are required to store the data file [DATA_FILE], less area is required in the die of an IC to implement the eFuse array 130 to permanently store the data.

Since the data file [DATA_FILE] is compressed and [COMPRESSED_FILE] is stored in the eFuse Array 130 (using [CELL_DATA] to facilitate such storage), the system 100 includes a data decompression module 140 which has an input 142 coupled to receive the data from the eFuse array 130. The data decompression module 140 decompresses the compressed data and reverses the compression applied by the compression module 110. The data decompression module 140 may be implemented in hardware (e.g., logic circuitry, state machine, microprocessor, application-specific-integrated-circuit), firmware and/or software.

In an example embodiment, the data decompression module 140 is a decoder which decodes the data in the eFuse array 130 and reproduces the data of the original data file [DATA-FILE]. In some embodiments, the data decompression module 140 includes a computer-readable medium (e.g. volatile memory, non-volatile memory and/or non-transitory memory) having program code stored therein to decode the data in the eFuse array 130 and reproduce original data of the data file [DATA_FILE]. As a result of the decompression applied by the decompression module 140, the reproduced data has more binary strings than the compressed file data [COMPRESSED_FILE] which is permanently stored in the eFuse array 130.

The system 100 includes a processor 150 (e.g. a microprocessor, a microcontroller, logic circuitry and/or a state machine) which has an input 152 coupled to receive the decoded data from the decompression module 140. The processor 150 may write the decoded data into a bank of registers 160 or any type of transitory memory to facilitate access to the information stored in the eFuse array 130. In another embodiment, the information is directly retrieved, decompressed and utilized without storing the decompressed data in the memory 160.

In an example embodiment, the binary strings of the data file [DATA_FILE] is a digital representation of a device-trim file which contains device-specific trims for the IC. For example, an inbuilt temperature sensor in a device may have offset errors that vary from device to device. A device specific trim may be applied to compensate for the offset error.

In an example embodiment, the eFuse array 130, the decompression module 140, the microcontroller 150, and the register 160 are implemented in the IC 102.

FIG. 2 is a block diagram of a system 200 for applying a patch to an IC 202 of an example embodiment. In an example embodiment, the patch may include software that applies a set of changes to the IC to fix, change and/or improve it. The patch can improve the functionality, usability or performance of the IC. In some example embodiments, the patch can release some functionalities or features to selected group of users. In other embodiments, the patch can restrict selected group of users from accessing some functionalities or features.

The system 200 includes a patch file 204 which has a string of binary bits [PATCH_FILE] which is a digital representation of the patch code that will be permanently stored in an eFuse array. In an example embodiment, the patch code includes instructions to be executed by an on-chip processor (e.g. a microcontroller, a microcontroller, logic circuitry and/or a state machine). The system 200 includes a data compression module 210 which has an input 212 coupled to receive the patch file [PATCH_FILE]. The data compression module 210 reduces the size of (e.g. compresses) the patch file [PATCH_FILE] and provides a compressed data file [COMPRESSED_FILE] at an output 214. As a result of the compression, the compressed data file [COMPRESSED_FILE] has fewer binary bits than the patch file 204 [DATA_FILE].

The system includes an eFuse controller 220 which has an input 222 coupled to receive the compressed data file [COMPRESSED_FILE]. The eFuse controller 220 provides cell data [CELL_DATA] to program an eFuse array 230 to permanently store the binary bits of the compressed data file [COMPRESSED_FILE]. The cell data [CELL_DATA] is a digital representation of the state of the eFuses in the eFuse array 230 and facilitates the storage of the compressed data file [COMPRESSED_FILE] in the eFuse array 230.

The system 200 includes a data decompression module 240 which has an input 242 coupled to receive the data stored in the eFuse array 230. The data decompression module 240 decompresses the compressed data file [COMPRESSED_FILE] and reproduces the patch file [PATCH_FILE].

The system 200 includes a memory such as a random access memory (RAM) 250 (or, for example, any type of non-transitory memory) which has an input 252 coupled to receive the patch file [PATCH_FILE] from the decompression module 240. The patch file is loaded into the RAM 250. The system 200 includes a processor 260 (e.g. a mircroprocessor, a microcontroller, logic circuitry and/or a state machine) which has an input 262 coupled to receive the patch file [PATCH_FILE] from the RAM 250 or, in an alternative embodiment, directly from decompression module 240. The processor 260 processes and executes the patch file (i.e., applies the patch to the IC).

An advantage of the system 200 is that the patch can be applied to a semiconductor device after fabrication without requiring a user to download and install software. The system 200 can apply the patch automatically upon being powered-up, thus preventing a user from bypassing the patch. The system 200 can add feature enhancements or restrictions without requiring the user to download and install the patch.

Figures 3, 4:
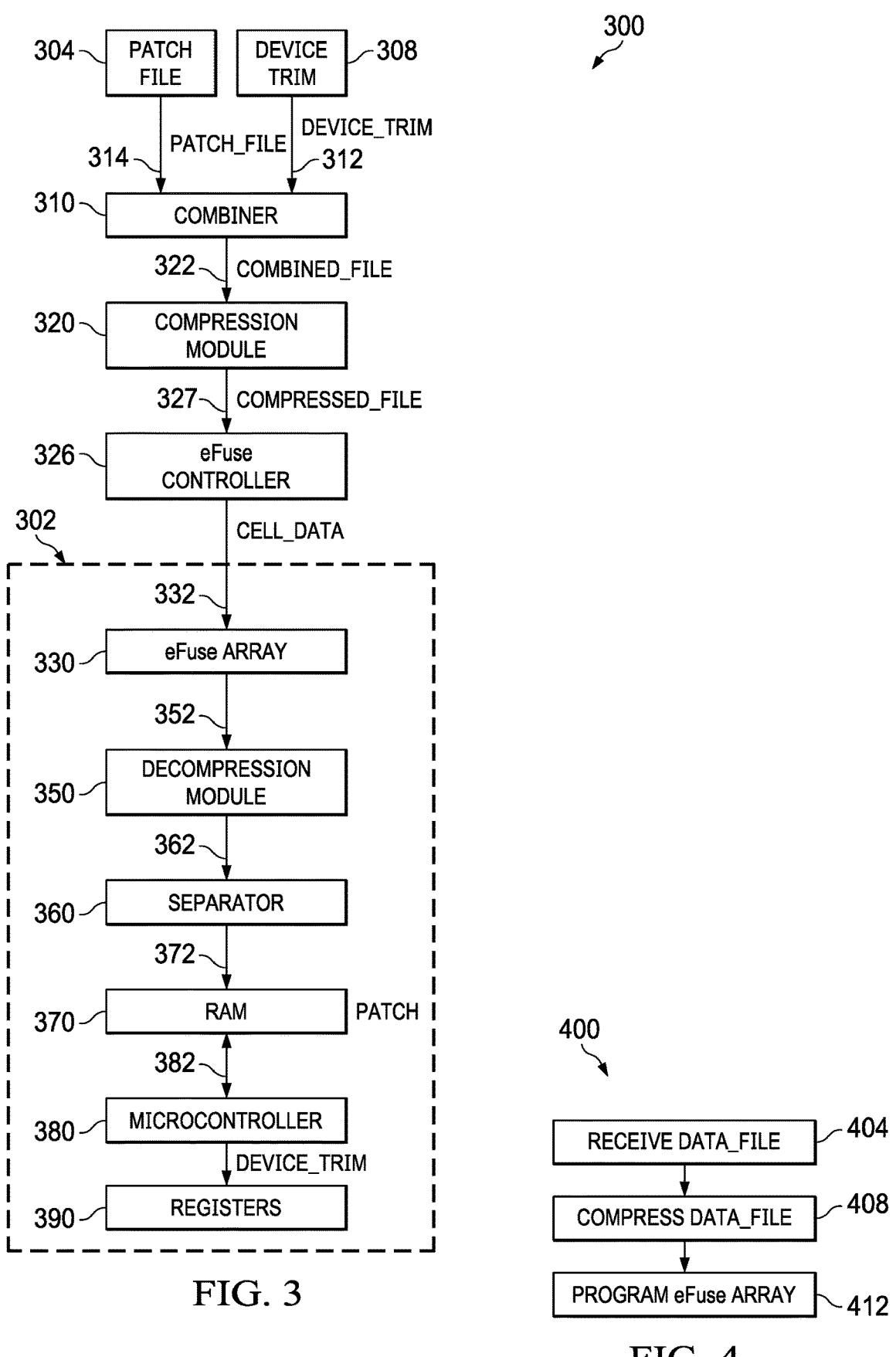
FIG. 3 is a block diagram of a system for applying a patch and device trims to an IC.
FIG. 4 is a flow diagram of a method for programming an eFuse array in an IC.

FIG. 3 is a block diagram of a system 300 for applying a patch and/or device-specific trims (e.g. device adjustments based on device-to-device variations, e.g. due to process or other variations, temperature variations and/or other variations determined during design or subsequent device testing) to an IC 302. The system 300 includes a patch file 304 [PATCH_FILE] which has a first string of binary bits which is a digital representation of the patch code that will be permanently stored in an eFuse array. The system 300 includes a device trim file 308 [DEVICE_TRIM] which has a second string of binary bits which is a digital representation of the device trim code that will be permanently stored in the eFuse array.

The system 300 includes a combiner module 310 which has a first input 312 coupled to receive the first string of binary bits of the device trim file [DEVICE_TRIM] and has a second input 314 coupled to receive the second string of binary bits of the patch file [PATCH_FILE]. The combiner module 310 combines the first and second strings and outputs a combined string of binary bits [COMBINED_FILE]. In one example embodiment, the combiner module 310 adds one or more headers to the [COMBINED_FILE] to indicate the location (e.g., byte number) where the device trim file begins and ends and where the patch file begins and ends. Thus, the headers indicate the boundaries of the [PATCH_FILE] and the [DEVICE_TRIM]. As explained below, a separation module uses the headers to separate the [PATCH_FILE] and [DEVICE_TRIM].

In an example embodiment, the combiner module 310 includes a computer readable medium (e.g non-transitory memory) having program code recorded thereon to combine the device trim file [DEVICE_TRIM] and the patch file [PATCH_FILE] and provide the combined file [COMBINED_FILE].

The system 300 includes a data compression module 320 which has an input 322 coupled to receive the combined file [COMBINED_FILE]. The data compression module 320 reduces the size (e.g. compresses) of the combined string of binary bits in the combined file [COMBINED_FILE] and provides a compressed data file [COMPRESSED_FILE] to eFuse controller 326. As a result of the compression, the compressed data file [COMPRESSED-FILE] has fewer binary bits than the combined string of binary bits in the combined file [COMBINED_FILE].

The system 300 includes an eFuse controller 326 which has an input 327 coupled to receive the compressed data file [COMPRESSED_FILE]. The eFuse controller 326 provides cell data [CELL_DATA] to cause an eFuse array 330 to permanently store the binary bits of the compressed data file [COMPRESSED_FILE]. The cell data [CELL_DATA] is a digital representation of the state (e.g. which fuses are available to program) of the eFuses in the eFuse array 330.

The system 300 includes a data decompression module 350 which has an input 352 coupled to receive the data stored in the eFuse array 330. The data decompression module 350 decompresses the data and reproduces the combined data file [COMBINED_FILE] which includes the patch file [PATCH_FILE] and the device trim file [DEVICE_TRIM].

The system 300 includes a separation module 360 which has an input 362 coupled to receive the combined data file [COMBINED_FILE]. The separation module 360 separates the combined data file into the patch file [PATCH_FILE] and the device trim file [DEVICE_TRIM]. In an example embodiment, the separation module 360 uses the headers in the COMBINED_FILE to separate the patch file and the device trim file.

In an example embodiment, the separation module 360 includes a computer readable medium (e.g. non-transitory memory) having program code stored therein to separate the combined data file [COMBINED_FILE] into the device trim file [DEVICE_TRIM] and the patch file [PATCH_FILE].

The system 300 includes a memory 370 (e.g. random assess memory or any type of non-transitory memory) which has an input 372 coupled to receive the patch file [PATCH_FILE] and the device-trim file [DEVICE_TRIM]. These two files are loaded into the RAM 370. In an example embodiment, the separation module 360 may be configured to load the patch file and the device-trim file into the RAM 370. In other embodiments, the data decompression module 350 may be configured to separate the combined data file into the patch file and the device-trim file and load these two files into the RAM 370. In another embodiment, the separation module 360 may provide the patch file and the device-trim file directly to processor 380.

The system 300 includes a processor 380 (e.g. a microcontroller, a microprocessor, a state machine, logic circuitry and/or software) which has an input 382 coupled to receive the patch file [PATCH_FILE] and the device trim file [DEVICE_TRIM] from the RAM 370. The processor 380 processes and executes the patch file and the device trim file (i.e., applies the patch and the device trims to the IC). The processor 380 can write the device trims into a bank of registers 390.

In yet another embodiment, the system 300 may include a read-only memory (ROM) (not shown in FIG. 3) which receives the patch file and the device-trim file from the separation module 360. The patch file and the device-trim file may be stored in the ROM. The processor 380 may access the ROM and apply the patch file and the device-trim file to the IC.

In an example embodiment, the eFuse array 330, the decompression module 350, the separation module 360, the RAM 370, the microcontroller 380, and the register 390 are implemented in the IC 302.

FIG. 4 is a flow diagram 400 of a method for programming an eFuse array in an IC. In block 404, an eFuse data file [DATA_FILE] comprising a string of binary bits is received. The string of binary bits is a digital representation of the data (e.g., 1.8K bits, 2.5K bits) that will be permanently stored in the eFuse array. In block 408, the data file [DATA_FILE] is compressed and a compressed data file [COMPRESSED_FILE] is generated. In an example embodiment, an encoder is used to reduce the size of the data file [DATA_FILE] and provide the compressed data file [COMPRESSED_FILE]. As a result of the compression, the compressed data file [COMPRESSED_FILE] has fewer binary bits than the data file [DATA_FILE].

In block 412, compressed data file [COMPRESSED_FILE] is permanently stored in the eFuse array by programming the eFuse array. In an example embodiment, an eFuse controller is used to program the eFuse array.

In some embodiments of the invention, the data file 104 may be the same as or similar to data file 204 and/or the combination of data files 304 and 308; compression modules 110, 210 and/or 320 may have same or similar implementation and/or construction; eFuse controllers 120, 220 and/or 326 may have same or similar implementation and/or construction; eFuse arrays 130, 230 and/or 330 may have same or similar implementation and/or construction; decompression modules 140, 240 and/or 350 may have same or similar implementation and/or construction; processors 150, 250 and/or 380 may have same or similar implementation and/or construction; and/or memories 160, 260 and/or 390 may have same or similar implementation and/or construction. While the example embodiments of FIGS. 1, 2 and 3 suggest that certain elements are included in an integrated circuit while other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described embodiments, and other embodiments are possible, within the scope of the claims.

What is claimed is:

1. A system comprising:
a processor configured to:
combine a patch file and a device-trim data file to generate a combined file, the combined file having a first plurality of bits;
compress the combined file to output a compressed data file having a second plurality of bits that is less than the first plurality of bits;
and
an integrated circuit coupled to the processor and including:
an eFuse array operable to store the compressed data file; and
a decompressor coupled to the eFuse array and operable to decompress the compressed data file stored in the eFuse array.

2. The system of claim 1, wherein the processor is configured to provide the compressed data file by eliminating statistical redundancies in the first plurality of bits of the combined file.

3. The system of claim 1, wherein the processor is configured to reduce the size of the combined file and provide the compressed data file.

4. The system of claim 1, wherein the first plurality of bits of the combined file is a digital representation of device-specific trims for an IC.

5. A system comprising:
a data compression module having an input coupled to receive a device-trim file and a patch file, the device-trim file and the patch file collectively having a first plurality of bits, the data compression module to output a compressed data file having a second plurality of bits that is less than the first plurality of bits; and
an integrated circuit coupled to the data compression module and comprising:
an eFuse array operable to store the compressed data file including a representation of the patch file and the device-trim file;

a data decompression module coupled to the eFuse array and, based on receiving the compressed data file, output a decompressed data file; and a processor coupled to the data decompression module and operable to apply device-specific trims to the IC based on the decompressed data file.

6. The system of claim 5, wherein the first plurality of bits of the device-trim file is a digital representation of device specific trims.

7. The system of claim 5, wherein the processor is operable to write the device-specific trims in a register.

8. The system of claim 5, wherein the data decompression module is a decoder operable to provide the device-trim file by decoding the compressed data file.

9. The system of claim 5, wherein the data compression module comprises a first computer-readable medium having program code stored therein that is configured to reduce the size of the device-trim file and provide the compressed data file.

10. The system of claim 5, further comprising an eFuse controller having an input coupled to receive the compressed data file and operable to program the eFuse array.

11. The system of claim 5, wherein the data decompression module comprises a third computer-readable medium having program code stored therein that is configured to decode the compressed data file.

12. A system comprising:

a non-transitory computer readable medium storing instructions configured cause a processor to:

compress a patch file and a device-trim file to output a compressed file having a second plurality of bits that is less than a first plurality of bits of the device-trim file and the patch file;

cause the compressed filed to be stored in an eFuse array of an integrated circuit;

output a decompressed file based on the compressed file; and cause the decompressed file to be stored in a random access memory (RAM).

13. The system of claim 12, wherein the instructions are configured to cause the processor to receive the patch file from the RAM and apply the patch to the IC.

14. The system of claim 12, wherein the first plurality of bits includes a digital representation of the patch file.

15. The system of claim 12, wherein the instructions are configured to cause the processor to program the eFuse array.

16. The system of claim 12, wherein the instructions are configured to cause the processor to decode the compressed file.

17. A system comprising:

a patch file comprising a first plurality of bits;

a device-trim data file comprising a second plurality of bits;

a combiner module having a first input coupled to receive the first plurality of bits and a second input coupled to receive the second plurality of bits, the combiner module operable to combine the first and second plurality of bits and provide a combined bits;

a data compression module having an input coupled to receive the combined bits and operable to reduce the size of the combined bits and provide a compressed data file, wherein the compressed data file has fewer bits than the combined bits;

an eFuse controller having an input coupled to receive the compressed data file and in response operable to program an eFuse array to store the compressed data file in the eFuse array;

a data decompression module having an input coupled to receive the compressed data file from the eFuse array and operable to decompress the compressed data file and provide a decompressed file comprising the first and the second plurality of bits;

a separation module having an input coupled to receive the decompressed file and operable to separate the decompressed file into the patch file having the first plurality of bits and the device-trim data file having the second plurality of bits; and a random access memory (RAM) having an input coupled to receive the patch file and the device-trim data file, wherein the patch file and the device-trim data file are stored into the RAM.

18. The system of claim 17, wherein the first plurality of bits is a digital representation of the patch file.

19. The system of claim 17, wherein the second plurality of bits is a digital representation of device-specific trims.

20. The system of claim 17, further comprising a processor having an input coupled to receive the patch file from the RAM and operable to process and apply the patch to the IC.

21. The system of claim 17, further comprising a processor having an input coupled to receive the device-trim data file from the RAM and operable to process and apply the device-specific trims to the IC.

22. The system of claim 17, wherein the data compression module comprises a first computer-readable medium having program code stored therein to reduce the size of the combined bits and provide the compressed data file.

23. The system of claim 17, wherein the eFuse controller comprises a second computer readable medium having program code stored therein to program the eFuse array in response to the compressed data file.

24. The system of claim 17, wherein the data decompression module comprises a third computer-readable medium having program code stored therein to decode the compressed data file.

* * * * *